(12) United States Patent
Kuhara et al.

(10) Patent No.: US 7,217,957 B2
(45) Date of Patent: May 15, 2007

(54) OPTICAL TRANSMISSION MODULE

(75) Inventors: Yoshiki Kuhara, Osaka (JP); Naoyuki Yamabayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/350,681

(22) Filed: Jan. 24, 2003

(65) Prior Publication Data

US 2003/0151121 A1 Aug. 14, 2003

(30) Foreign Application Priority Data

Feb. 14, 2002 (JP) ............................. 2002-037272

(51) Int. Cl.
*H01L 33/00* (2006.01)
*H01L 27/15* (2006.01)

(52) U.S. Cl. ............................. 257/98; 257/81; 257/82; 257/88; 257/100

(58) Field of Classification Search ............ 257/79–84, 257/88, 93, 98–100, 431–433, 448, 666, 257/676, 787; 385/88–92, 14
See application file for complete search history.

(56) References Cited

U.S. PATENT DOCUMENTS

| | | | | |
|---|---|---|---|---|
| 5,787,215 A | * | 7/1998 | Kuhara et al. | ............... 385/88 |
| 6,157,050 A | * | 12/2000 | Fukuoka | ..................... 257/82 |
| 6,301,401 B1 | * | 10/2001 | La | ............................ 385/14 |
| 6,540,412 B2 | * | 4/2003 | Yonemura et al. | ............ 385/88 |
| 6,563,137 B2 | * | 5/2003 | Uchida | ........................ 257/84 |
| 6,635,971 B2 | * | 10/2003 | Asada et al. | ................ 257/789 |
| 6,715,934 B2 | * | 4/2004 | Suzuki et al. | ................ 385/88 |

FOREIGN PATENT DOCUMENTS

| | | |
|---|---|---|
| JP | 11109184 A | 4/1999 |
| JP | 2001-324649 | 11/2001 |
| JP | 2002-162527 | 6/2002 |
| WO | WO 00/08505 | 2/2000 |

OTHER PUBLICATIONS

Hayashi, T. "An Innovative Bonding Technique for Optical Chips Using Solder Bumps That Eliminate Chip Positioning Adjustments," IEEE Trans. Actions on Components, Hybrids, and Manufacturing Technology, 1992, Apr., vol. 15, No. 2, p. 225-230.

* cited by examiner

*Primary Examiner*—Ori Nadav
(74) *Attorney, Agent, or Firm*—Fish & Richardson P.C.

(57) ABSTRACT

In a surface-mounted optical transmission module, a laser diode serving as a light emitting device that converts an electric signal into an optical signal, and an optical waveguide serving as an optical transmission line that transmits and outputs the optical signal from the laser diode are placed on a substrate. A driving device for controlling the driving of the laser diode is placed at a predetermined position on the upper surface of the optical waveguide element, which is on the same side as an optical waveguide element (on the downstream side in the optical-signal transmitting direction) relative to the laser diode. This configuration eliminates the necessity of placing the driving device at a position distanced from the laser diode, whereby the size of the optical transmission module can be reduced, and this allows the optical transmission module to transmit optical signals at high speed.

5 Claims, 12 Drawing Sheets

OPTICAL TRANSMISSION MODULE

BACKGROUND OF THE INVENTION

1. Field of the Invention

The present invention relates to an optical transmission module having a light emitting device that converts an electric signal into an optical signal.

2. Description of the Related Art

In optical communication systems using light as an optical transmission means, optical transmission modules having a light emitting device for converting an electric signal into an optical signal are used as transmission equipment for transmitting an optical signal through an optical transmission line such as an optical fiber (see, for example, Japanese Unexamined Patent Application Publication No. 11-109184).

FIG. 9 is a partially cutaway side view showing the configuration of an example of a conventional optical transmission module. An optical transmission module 6 is a coaxial optical module in which a laser diode 65 serving as a light emitting device and the like are placed in a housing 60 such as a metal package. Inside the housing 60 of the optical transmission module 6, a ferrule 61, a converging lens 63, and the laser diode 65 are arranged so that their optical axes are aligned with one another. An optical signal emitted from the laser diode 65 enters an optical fiber 62, which extends in the ferrule 61, via the converging lens 63, and is then output from the optical fiber 62 to the outside. A photodiode 66 is placed on the backward side (lower side) of the laser diode 65. The photodiode 66 detects backward light from the laser diode 65 in order to monitor the driving state of the laser diode 65.

FIG. 10 is a sectional side view of another conventional optical transmission module. FIG. 11 is a top plan view of the optical transmission module shown in FIG. 10. An optical transmission module 7 is a surface-mounted optical module in which a laser diode 80 and an optical waveguide element 85 having an optical waveguide 86 that transmits and outputs an optical signal from the laser diode 80 are placed on a substrate 70.

In the optical transmission module 7, a ferrule 90, the optical waveguide element 85 having the optical waveguide 86, and the laser diode 80 are arranged so that their optical axes are aligned with one another. An optical signal emitted from the laser diode 80 enters an optical fiber 91, which extends in the ferrule 90, via the optical waveguide 86, and is then output from the optical fiber 91 to the outside. A waveguide type photodiode 81 for monitoring backward light is placed on the backward side of the laser diode 80. In the coaxial optical transmission module 6 shown in FIG. 9, the size is increased because of the three-dimensional structure, and this limits cost reduction. In contrast, in the surface-mounted optical transmission module 7 shown in FIGS. 10 and 11, the size and cost of the module can be reduced.

In an optical transmission module, a driving device, such as a driving IC, must be provided to control the driving of a light emitting device that converts an electric signal into an optical signal and outputs the optical signal so as to be transmitted by an optical communication system. In the coaxial optical transmission module 6 shown in FIG. 9, the ferrule 61 and optical elements such as the lens 63, etc. are placed on downstream side (upper side) of the laser diode 65, and the photodiode 66 and a metal base of the housing 60 are located on the backward side (lower side).

In the optical transmission module 6 having such a configuration, a driving device is placed outside the housing 60, or apart from the laser diode 65 inside the housing 60. In this case, the connection length between the laser diode 65 and the driving device is long, and this increases the size of the module. Moreover, it is difficult to drive the laser diode at high speed, because of the impedance of a wire between the laser diode 65 and the driving device.

In the case where a driving device is provided to the surface-mounted optical transmission module 7 shown in FIGS. 10 and 11, after the module 7 is mounted on a wiring board 95, as shown in FIG. 12, the module 7 is connected through wires 96 to a driving device 97 placed on the wiring board 95. The driving device 97 is also connected to a control IC 98. In such a configuration, the connection length between the laser diode 80 of the optical transmission module 7 and the driving device 97 is also long. Moreover, since the driving device 97 is provided outside the optical transmission module 7, the entire transmission equipment is increased in size.

In recent years, optical transmission systems have been required to increase the transmission data-rate at which optical signals are transmitted for communication, for example, from 1 Gbps to 5 Gbps. Optical transmission modules for transmitting optical signals are similarly required to have a higher transmission data-rate. In addition, in order to achieve optical communication systems capable of efficiently conducting multiple communications, size reduction of optical modules, such as an optical transmission module, is necessary.

SUMMARY OF THE INVENTION

The present invention has been made to meet the above requirements, and an object of the present invention is to provide a compact optical transmission module capable of high-speed transmission of optical signals.

In order to achieve the above object, the present invention provides an optical transmission module comprising: a light emitting device placed on a substrate and used for converting an electric signal into an optical signal; an optical transmission line placed on the substrate together with the light emitting device and used for transmitting and outputting the optical signal from the light emitting device; and a driving device placed at a predetermined position on the same side as the optical transmission line with respect to the light emitting device, and used for driving the light emitting device.

In the optical transmission module, light-receiving device used as a monitor for detecting backward light from the light-emitting device may be placed at a predetermined position on the side opposite to the optical transmission line with respect to the light-emitting device. In such a structure, the driving state of the light-emitting device can be monitored by detecting backward light from the light-emitting device with the light-receiving device for monitoring, and the light-emitting device can be driven stably.

The light emitting device used in the optical transmission module may be a laser diode.

The optical transmission line may be a planar surface optical waveguide. Alternatively, the optical transmission line may be an optical fiber or an optical fiber covered with a ferrule.

In the optical transmission module, N-number (N is an integer of two or more) of said light emitting devices may be arranged in parallel, and N-number of said optical transmission lines and N-number of said driving devices may be arranged in parallel corresponding to said N-number of light emitting devices. This makes it possible to transmit multi-channel optical signals from the single optical transmission module, and to further reduce the size of the optical transmission module per optical signal.

A submount for mounting the driving device thereon may be provided between the driving device and the optical transmission line. This allows the driving device to be properly placed on the side of the optical transmission line, as viewed from the light emitting device.

A metal lead frame may be provided as an electrical connecting means for connecting the driving device to the outside. This allows the driving device to properly control the driving of the light emitting device.

The light emitting device, the optical transmission line, and a predetermined optical path through which an optical signal passes may be covered by molding of a transparent resin. Alternatively, the entirety of the optical transmission module containing the substrate, the light emitting device, the optical transmission line, and the driving device may be molded with a resin. In this case, the components of the optical transmission module can be held reliably.

As described above in detail, the optical transmission module of the present invention has the following advantages. The above optical transmission module has a surface-mounted structure in which the light emitting device and the optical transmission line are placed on the substrate, and the driving device for controlling the driving of the light emitting device is placed on the side of optical transmission line (downstream side), as viewed from the light emitting device. Consequently, it is unnecessary to place the driving device at a position distanced from the light emitting device and the optical transmission line, and hence the size of the module can be reduced.

Since the driving device can be placed close to the light emitting device, the connection length between the light emitting device and the driving device can be reduced sufficiently. Consequently, the impedance of wiring between the light emitting device and the driving device is reduced, and the light-emitting device can be driven at high speed. As a result, it is possible to achieve an optical transmission module capable of high-speed transmission of optical signals.

Further objects, features, and advantages of the present invention will become apparent from the following description of the preferred embodiments with reference to the attached drawings.

DETAILED DESCRIPTION OF THE PREFERRED EMBODIMENTS

Figure 1:
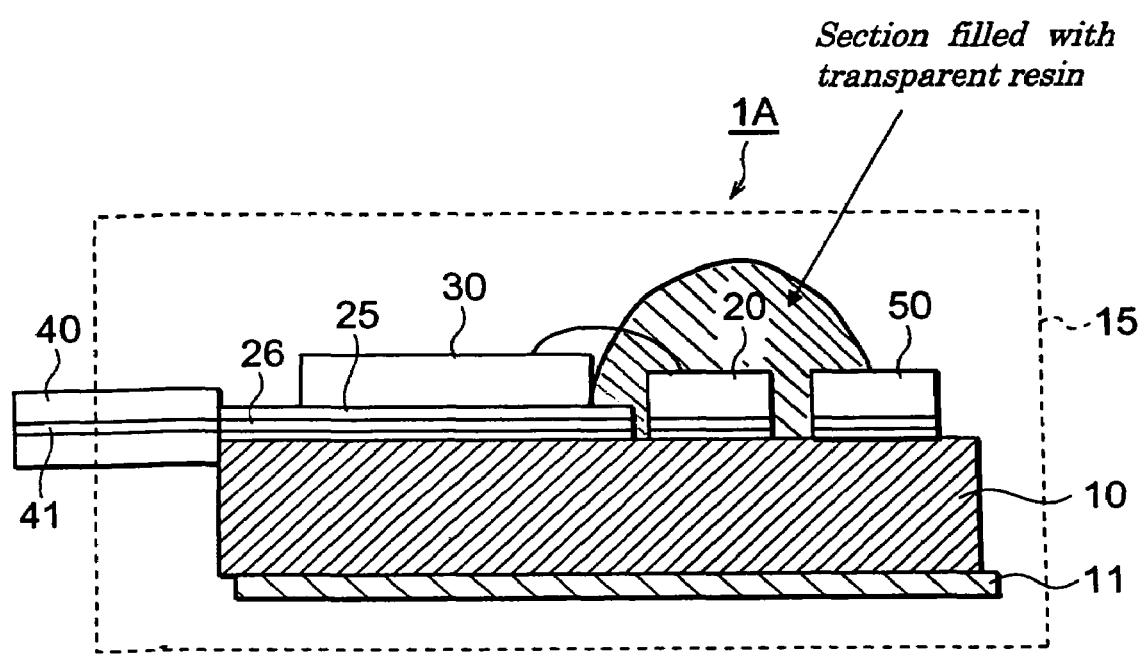
FIG. 1 is a sectional side view of an optical transmission module according to a first embodiment of the present invention.

Optical transmission modules according to the preferred embodiments of the present invention will be described in detail below with reference to the attached drawings. In the drawings, the same components are denoted by the same reference numerals, and redundant descriptions thereof are omitted. Furthermore, the proportions adopted in the drawings and in the descriptions are not necessarily equal each other.

Figure 2:
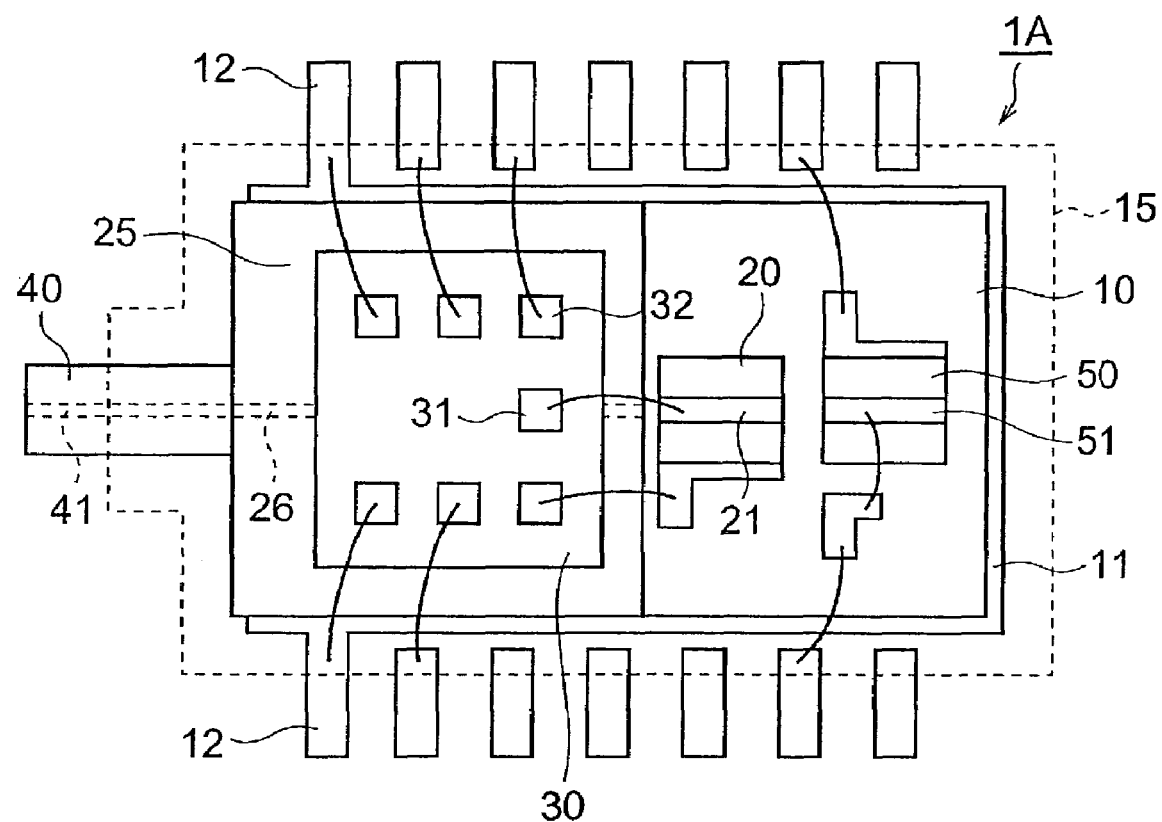
FIG. 2 is a top plan view of the optical transmission module shown in FIG. 1.

FIG. 1 is a sectional side view of an optical transmission module according to a first embodiment of the present invention. FIG. 2 is a top plan view of the optical transmission module shown in FIG. 1. The side view of the optical transmission module shown in FIG. 1 is a cross-section including the center axis thereof that is in parallel with an optical-signal transmitting direction (lateral direction in FIG. 2) in the optical transmission module.

An optical transmission module 1A is of a surface-mounted type optical module which converts an electric signal into an optical signal and transmits the optical signal. The optical transmission module 1A includes a substrate 10, a laser diode 20, a planar surface optical waveguide element 25, and a driving device 30.

The laser diode 20 is a light-emitting device for converting an electric signal into an optical signal and transmitting it with respect to an optical signal to be transmitted by the optical transmission module 1A. The laser diode 20 is placed on the substrate 10. The optical waveguide element 25 is also placed on the substrate 10, and includes a planar surface optical waveguide 26 serving as an optical transmission line that transmits and outputs an optical signal emitted from the laser diode 20.

The laser diode 20 and the optical waveguide element 25 are arranged so that the optical axis of the laser diode 20 and the optical axis of the optical waveguide 26 serving as the optical transmission line are aligned with each other. This allows an optical signal emitted from a front end of the laser diode 20 to efficiently enter the optical waveguide 26. A front end of the optical waveguide element 25 is connected to a ferrule 40. The ferrule 40 is placed such that the optical waveguide 26 and an optical fiber 41 extending in the ferrule 40 for outputting an optical signal are connected optically.

A waveguide type photodiode 50 is placed on the substrate 10 behind (on the backward side of) the laser diode 20. The photodiode 50 is a monitoring light-receiving device for detecting backward light emitted backward from the laser diode 20. The photodiode is placed at a predetermined position on the side opposite to the optical waveguide 26 relative to the laser diode 20 such that its optical axis is aligned with the optical axis of the laser diode 20.

The driving device 30 is a circuit device for supplying necessary electric signals, which are converted into optical signals, to the laser diode 20 in order to control the driving of the laser diode 20. The driving device 30 is placed at a predetermined position on the upper surface of the optical waveguide element 25. That is, the driving element 30 is placed at a predetermined position on the side of the optical waveguide 26 serving as the optical transmission line, as viewed from the side of the laser diode 20. In order to input an electric signal from the driving element 30 to the laser diode 20, electrodes 21 of the laser diode 20 and corresponding electrodes 31 of the driving device 30 are electrically connected by bonding wires. The driving device 30 is formed of, for example, an Si—IC or a GaAs—IC.

A metal lead frame 11 is provided on the lower side of the substrate 10, and serves as an electrical connecting means for connecting the driving device 30 to the outside. The lead frame 11 has a predetermined number of lead pins 12 arranged on each of the right and left sides viewed from the center axis of the optical transmission module 1A, the center axis being in parallel with the optical-signal transmitting direction. In order to exchange electric signals between the driving device 30 and the outside, electrodes 32 of the driving device 30 and corresponding lead pins 12 of the lead frame 11 are electrically connected by bonding wires. Electrodes 51 of the monitoring photodiode 50 are also electrically connected to corresponding lead pins 12 of the lead frame 11 by bonding wires.

Figure 3:
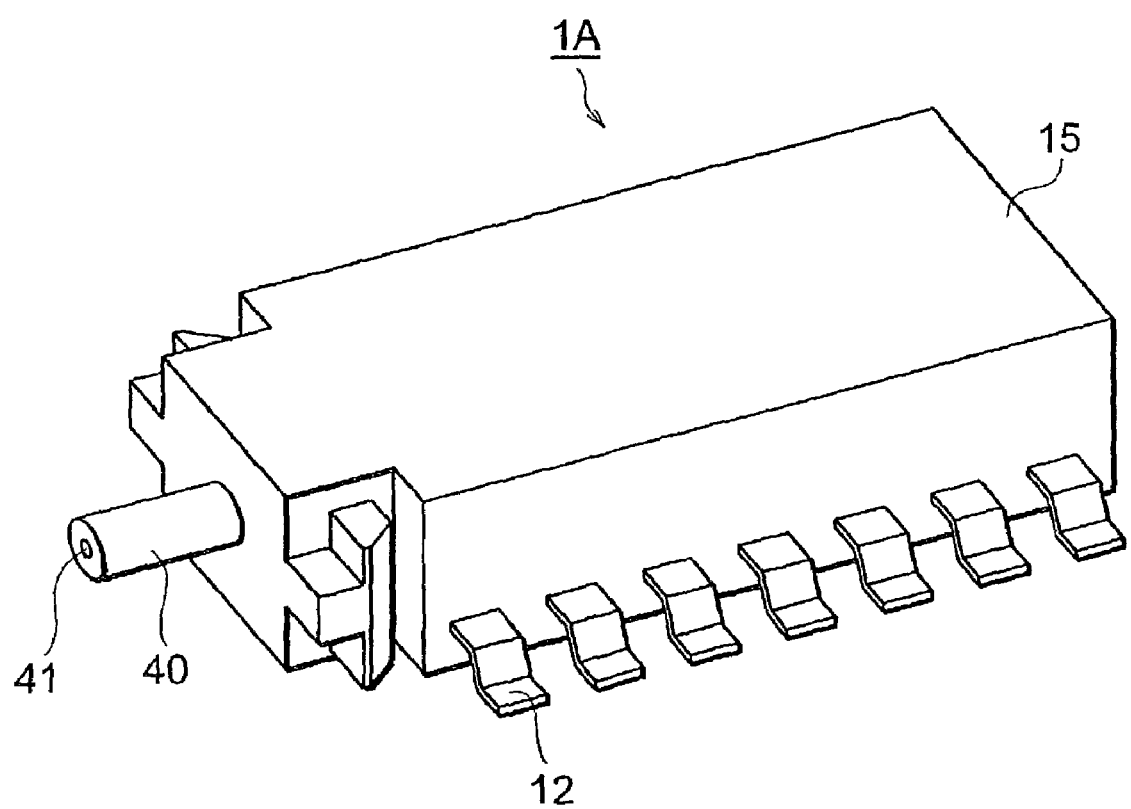
FIG. 3 is a perspective view showing the external appearance of the optical transmission module shown in FIGS. 1 and 2.

FIG. 3 is a perspective view showing the external appearance of the optical transmission module 1A shown in FIGS. 1 and 2. In the optical transmission module 1A, the entirety thereof containing the substrate 10, the lead frame 11, the laser diode 20, the optical waveguide element 25 having the optical waveguide 26, the driving device 30, and the monitoring photodiode 50 is made of a molding by transfer-molding a predetermined resin. This molding forms the external shape of the optical transmission module 1A except that the lead pins 12 of the lead frame 11 and the ferrule 40 protrude outward from the resin molding 15 as shown in FIG. 3.

The laser diode 20, the optical waveguide 26 serving as the optical transmission line, and an optical path, through which optical signal passes, between the laser diode 20 and the optical waveguide 26 are filled with a transparent resin that is the same as or different from the resin of the molding 15. Similarly, an optical path between the laser diode 20 and the monitoring photodiode 50, through which backward light passes, is filled with transparent resin. In FIGS. 1 and 2, only the outline of the resin molding 15 is shown by a broken line in order to show the inner configuration of the optical transmission module 1A.

In the above-described configuration, when an electric signal for directing the transmission of an optical signal is input from the driving device 30 to the laser diode 20, it is converted into an optical signal in the laser diode 20 and the optical signal is emitted therefrom. The optical signal from the laser diode 20 enters the optical fiber 41, which extends in the ferrule 40, via the optical path between the optical waveguide 26 of the optical waveguide element 25 and the laser diode 20 and through the optical waveguide 26, and is output outside from the optical fiber 41. The photodiode 50 detects backward light emitted from the laser diode 20, and thereby the driving state of the laser diode 20 is monitored.

Advantages of the optical transmission module 1A of the first embodiment shown in FIGS. 1 to 3 will now be described. The optical transmission module 1A has a surface-mounted structure in which the laser diode 20 serving as the light emitting device and the optical waveguide element 25 having the optical waveguide 26 serving as the optical transmission line are placed on the substrate 10. Moreover, the driving device 30 for driving the laser diode 20 is placed on the side of the optical transmission line, as viewed from the laser diode 20, that is, on the downstream side of the laser diode 20 in the optical-signal transmitting direction.

This eliminates the necessity of placing the driving device at a position distanced from the laser diode 20 and from the optical waveguide 26 serving as the optical transmission line. Therefore, it is possible to reduce the size and cost of the optical transmission module 1A. Such an optical transmission module 1A is superior in terms of mass productivity.

Since the driving device 30 can be placed close to the laser diode 20, as described above, the connection length therebetween can be shortened sufficiently. Consequently, the impedance of the wires therebetween can be reduced, and the laser diode 20 can be driven at high speed. As a result, it is possible to achieve an optical transmission module that can transmit optical signals at high speed.

In the first embodiment, the metal lead frame 11 is used as the electrical connecting means for allowing electric signals to be exchanged between the driving device 30 and an external circuit device or the like. This makes it possible to properly exchange electric signals with the outside.

The monitoring photodiode 50 is placed at a predetermined rear position on the side opposite to the optical waveguide element 25 relative to the laser diode 20. Because of such a structure, the driving state of the laser diode 20 can be monitored by detecting backward light from the laser diode 20 with the monitoring photodiode 50, so that the laser diode 20 can be stably driven.

Furthermore, the driving device 30 is placed at a predetermined position on the side opposite to the photodiode 50 relative to the laser diode 20. Therefore, even when the monitoring photodiode 50 is provided for the laser diode 20, the driving device 30 can be properly positioned without increasing the size of the module.

Since the entirety of the optical transmission module 1A containing the substrate 10, the laser diode 20, the optical waveguide element 25, and the driving device 30 is formed of the resin molding 15, the components of the optical transmission module 1A can be held reliably. Furthermore, since the laser diode 20, the optical waveguide element 25, and the predetermined optical paths through which an optical signal passes are filled with transparent resin, the components of the optical transmission module 1A can be held reliably, and optical signals can be transmitted at a sufficient transmittance.

It is preferable to use as the transparent resin a resin that can sufficiently transmit light having a wavelength corresponding to an optical signal to be transmitted by the optical transmission module 1A. The resin for the molding 15 of the entire module may be transparent, although it is not of essential necessity. The entire transmission module may have a formation other than a resin molding, depending on its specific configuration, for example.

An example of a production method and a configuration for the optical transmission module 1A of the first embodiment will now be described.

In the first embodiment, first, a (100) Si substrate (for example, 3 mm×7 mm×1.5 mm) is prepared as a substrate 10. Then, a thermal oxide film made of $SiO_2$ is formed on the Si substrate 10, and thereon formed in the enumerated order are an under-cladding layer (10 μm in thickness) made of $SiO_2$, a core layer (6 μm×6 μm) made of $SiO_2$—$GeO_2$ and having a linear waveguide pattern corresponding to an optical waveguide 26, and an over-cladding layer (10 µm in thickness) made of $SiO_2$. The multilayer structure thus obtained forms a planar surface optical waveguide element 25.

Subsequently, in the multilayer structure formed as the optical waveguide element 25, a portion thereof, where a laser diode 20 and a monitoring photodiode 50 are to be placed, within a predetermined area on the Si substrate 10, is removed by etching, and a metalized layer (metalized pattern) is formed in the portion so that the laser diode 20 and the photodiode 50 are to be soldered thereon. A laser diode 20 (an InGaAsP-LD having dimensions 300 µm×300 µm×150 µm) and a photodiode 50 (an InGaAs-PD having dimensions 300 µm×300 µm×150 µm) are mounted respectively at predetermined positions on the Si substrate 10, and a driving device 30 (a Si—IC having dimensions 2 mm×2 mm×0.5 mm) is mounted at a predetermined position on the optical waveguide element 25, and corresponding electrodes are connected with Au or Al wires by wire bonding.

Subsequently, the substrate 10 is bonded to a base metal (for example, Fe, Cu, or stainless steel) of a lead frame 11. A ferrule 40 through which an optical fiber 41 extends is fixed to abut an optical waveguide 26 of the optical waveguide element 26. The laser diode 20, an optical waveguide 26, an optical path portion through which light passes between the laser diode 20 and the optical waveguide 26, and an optical path portion through which backward light passes between the laser diode 20 and the photodiode 50 are potted with a silicone resin as the transparent resin. Furthermore, the entirety thus formed is transfer-molded with epoxy resin to form the resin molding 15 that constitutes an external shape of the module.

According to the above-described constitution and production method, the optical transmission module 1A shown in FIGS. 1 to 3 can be suitably produced. The configuration of the optical transmission module and the production method therefor are not limited to those in the above first embodiment. For example, instead of the Si substrate, a ceramic ($Al_2O_3$) substrate may be used as the substrate 10.

Figure 4:
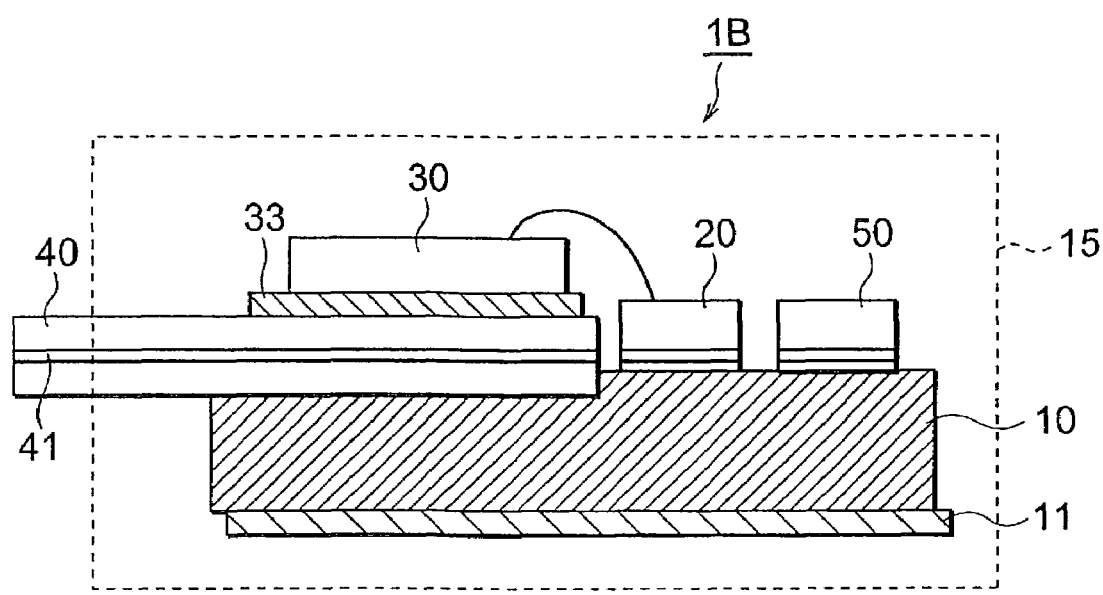
FIG. 4 is a sectional side view of an optical transmission module according to a second embodiment of the present invention.
Figure 5:
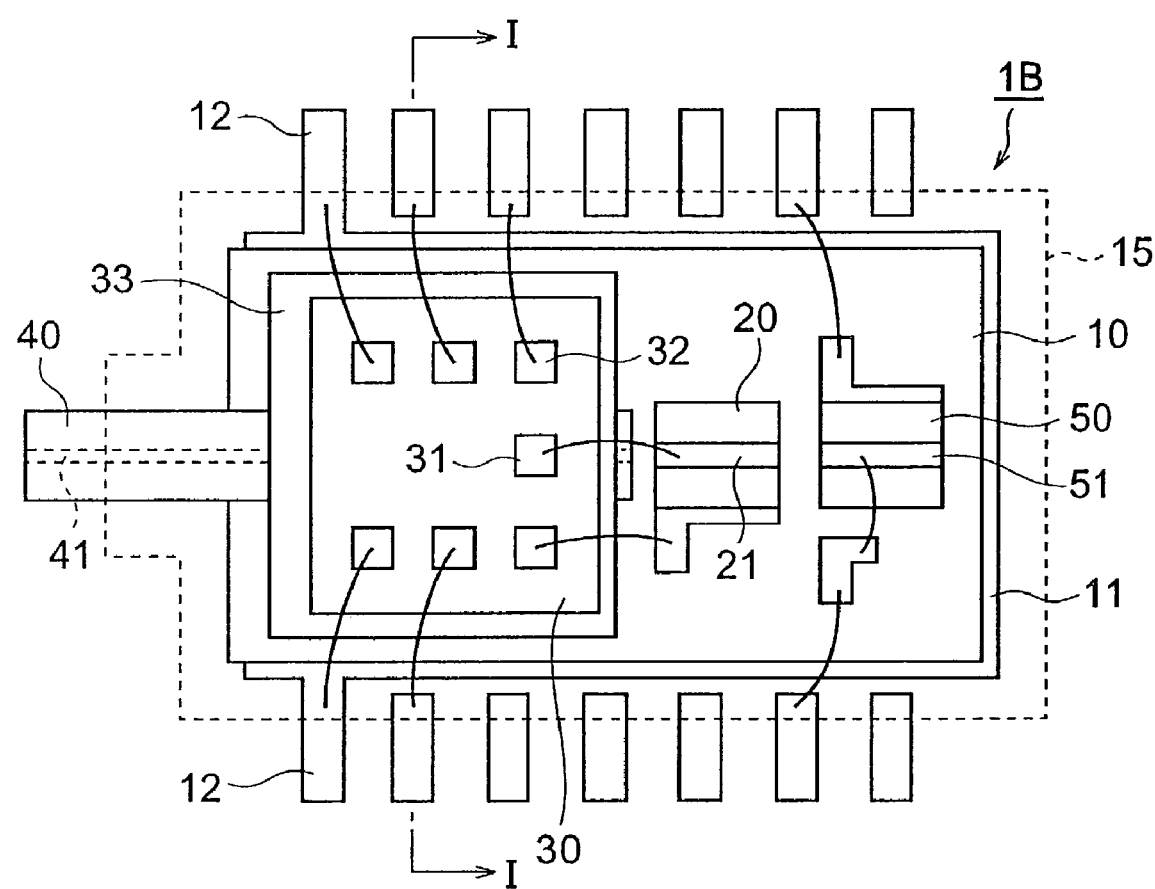
FIG. 5 is a top plan view of the optical transmission module shown in FIG. 4.

FIG. 4 is a sectional side view of an optical transmission module according to a second embodiment of the present invention. FIG. 5 is a top plan view of the optical transmission module shown in FIG. 4. An optical transmission module 1B of the second embodiment is of a surface-mounted type optical transmission module which includes a substrate 10, a laser diode 20, and a driving device 30.

The laser diode 20 is a light emitting device that converts an electric signal into an optical signal to be transmitted, and emits the optical signal. The laser diode 20 is placed on the substrate 10. A ferrule 40 is also placed on the substrate 10. An optical fiber 41 serving as an optical transmission line for transmitting and outputting an optical signal emitted from the laser diode 20 is provided extending in the ferrule 40.

The laser diode 20 and the optical fiber having ferrule 40 are arranged so that the optical axis of the laser diode 20 and the optical axis of the optical fiber 41 serving as the optical transmission line are aligned with each other. This allows an optical signal emitted from a front end of the laser diode 20 to efficiently enter the optical fiber 41.

A photodiode 50 serving as a monitoring light-receiving device for detecting backward light emitted backward from the laser diode 20 is placed on the substrate 10 behind (backward of) the laser diode 20. The photodiode 50 is placed at a predetermined position on the side opposite to the optical fiber having ferrule 40 with respect to the laser diode 20 such that the optical axis of the photodiode is aligned with the optical axis of the laser diode 20.

The driving device 30 is a circuit device for driving the laser diode 20, and is placed at a predetermined position above the ferrule 40 containing the optical fiber. That is, the driving device 30 is placed at a predetermined position on the same side as the ferrule 40 and the optical fiber 41 for an optical transmission line relative to the laser diode 20. In order to input an electric signal from the driving device 30 to the laser diode 20, the electrodes 21 of the laser diode 20 and the corresponding electrodes 31 of the driving device 30 are electrically connected by bonding wires.

Figure 6:
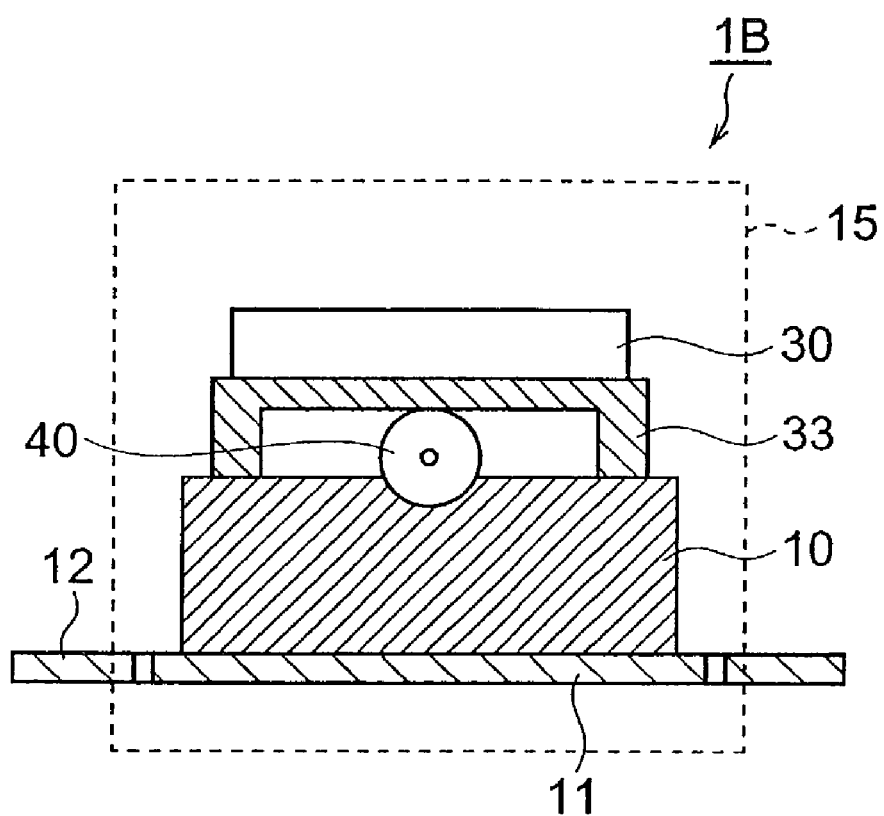
FIG. 6 is a cross-sectional view of the optical transmission module shown in FIGS. 4 and 5, as taken along the lines I—I in FIG. 5.

FIG. 6 is a cross-sectional view of the optical transmission module 1B, taken along the lines I—I in FIG. 5. In the second embodiment, as shown in FIG. 6, a submount 33 which crosses over the ferrule 40 containing the optical fiber is placed on the substrate 10 and between the driving device 30 and the ferrule 40 containing the optical fiber 41 for the optical transmission line such that the driving device 30 is placed on the upper surface of the submount 33.

A metal lead frame 11 having a predetermined number of lead pins 12 arranged on the right and left sides thereof is provided on the bottom face of the substrate 10. In order to exchange electric signals between the driving device 30 and the outside, electrodes 32 of the driving device 30 and corresponding lead pins 12 of the lead frame 11 are electrically connected by bonding wires. Electrodes 51 of the monitoring photodiode 50 are also electrically connected to corresponding lead pins 12 of the lead frame 11 by bonding wires.

In the optical transmission module 1B, the entirety thereof containing the substrate 10, the lead frame 11, the laser diode 20, the ferrule 40 having the optical fiber 41 extending therein, the driving device 30, and the monitoring photodiode 50 is made of a molding formed by transfer-molding with a predetermined resin such that the molding forms the exterior shape of the optical transmission module 1B. However, the lead pins 12 of the lead frame 11 and the ferrule 40 having the optical fiber therein protrude outward from the resin molding 15.

The laser diode 20, the optical fiber 41 for the optical transmission line, and an optical path through which an optical signal passes between the laser diode 20 and the optical fiber 41 are filled with a transparent resin that is the same as or different from the resin molding 15. Similarly, an optical path through which backward light passes between the laser diode 20 and the monitoring photodiode 50 is filled with a transparent resin.

In the above-described configuration, when an electric signal for directing the transmission of an optical signal is input from the driving device 30 to the laser diode 20, it is converted into an optical signal in the laser diode 20 and the optical signal is emitted therefrom. The optical signal from the laser diode 20 enters, via the optical path between the laser diode and the optical fiber 41 for outputting optical-signal, into the optical fiber 41 extending in the ferrule 40, and the optical signal is output outside from the optical fiber 41. The photodiode 50 detects backward light emitted from the laser diode 20 and the driving state of the laser diode 20 is monitored.

Advantages of the optical transmission module 1B of the second embodiment shown in FIGS. 4 to 6 will now be described. The optical transmission module 1B has a surface-mounted structure, and the driving device 30 is placed on the same side as the optical transmission line (on the downstream side) relative to the laser diode 20. Consequently, the size of the optical transmission module 1B can be reduced. Furthermore, since the driving device 30 is placed close to the laser diode 20, the connection length therebetween can be shortened sufficiently, and the laser diode 20 can be driven at high speed. Therefore, it is possible to achieve an optical transmission module that can transmit optical signals at high speed.

In the second embodiment, the driving device 30 is placed on the submount 33. Because of using the submount 33, the driving device 30 can be properly placed on the same side as the optical transmission line relative to the laser diode 20. For example, in a case in which the optical fiber having ferrule 40 is used as the optical transmission line for transmitting and outputting an optical signal from the laser diode 20, as in the second embodiment, by providing the submount 33 that crosses over the ferrule 40, the driving device 30 can be positioned such that it does not touch the portion of the ferrule 40 protruding on the substrate. The submount 33 may be made of, for example, $Al_2O_3$, aluminum nitride, or resin.

Figure 7:
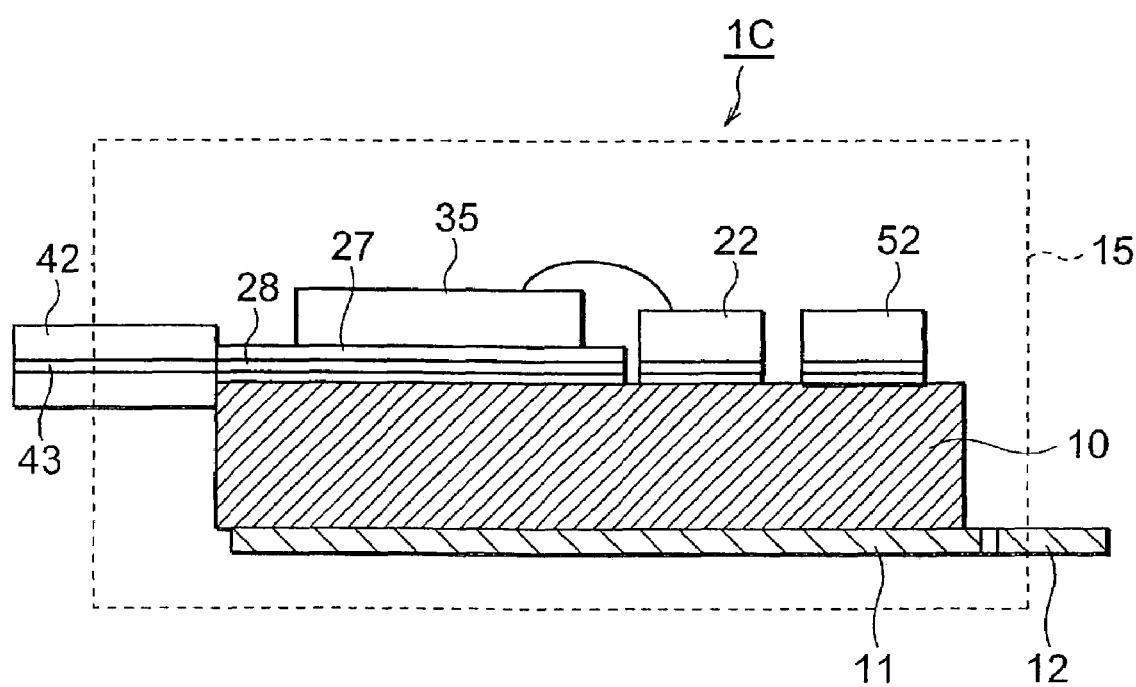
FIG. 7 is a sectional side view of an optical transmission module according to a third embodiment of the present invention.
Figure 8:
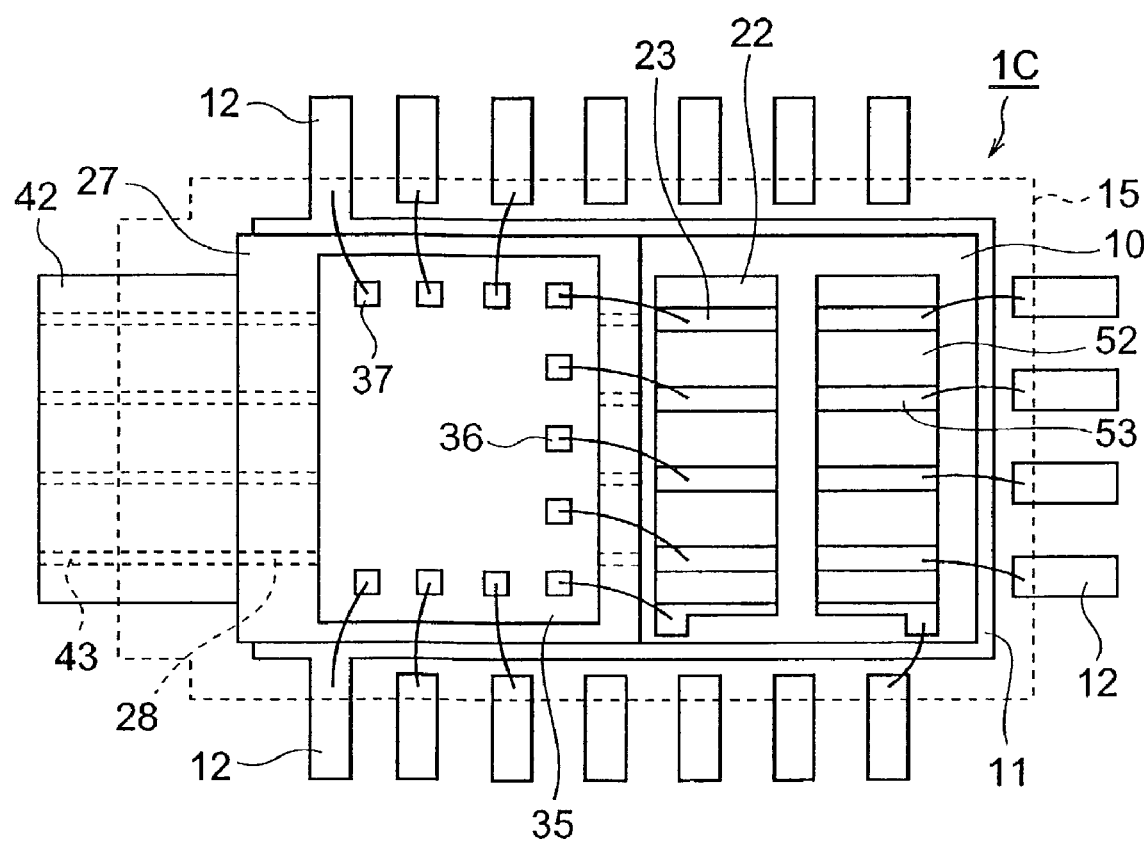
FIG. 8 is a top plan view of the optical transmission module shown in FIG. 7.
Figure 9:
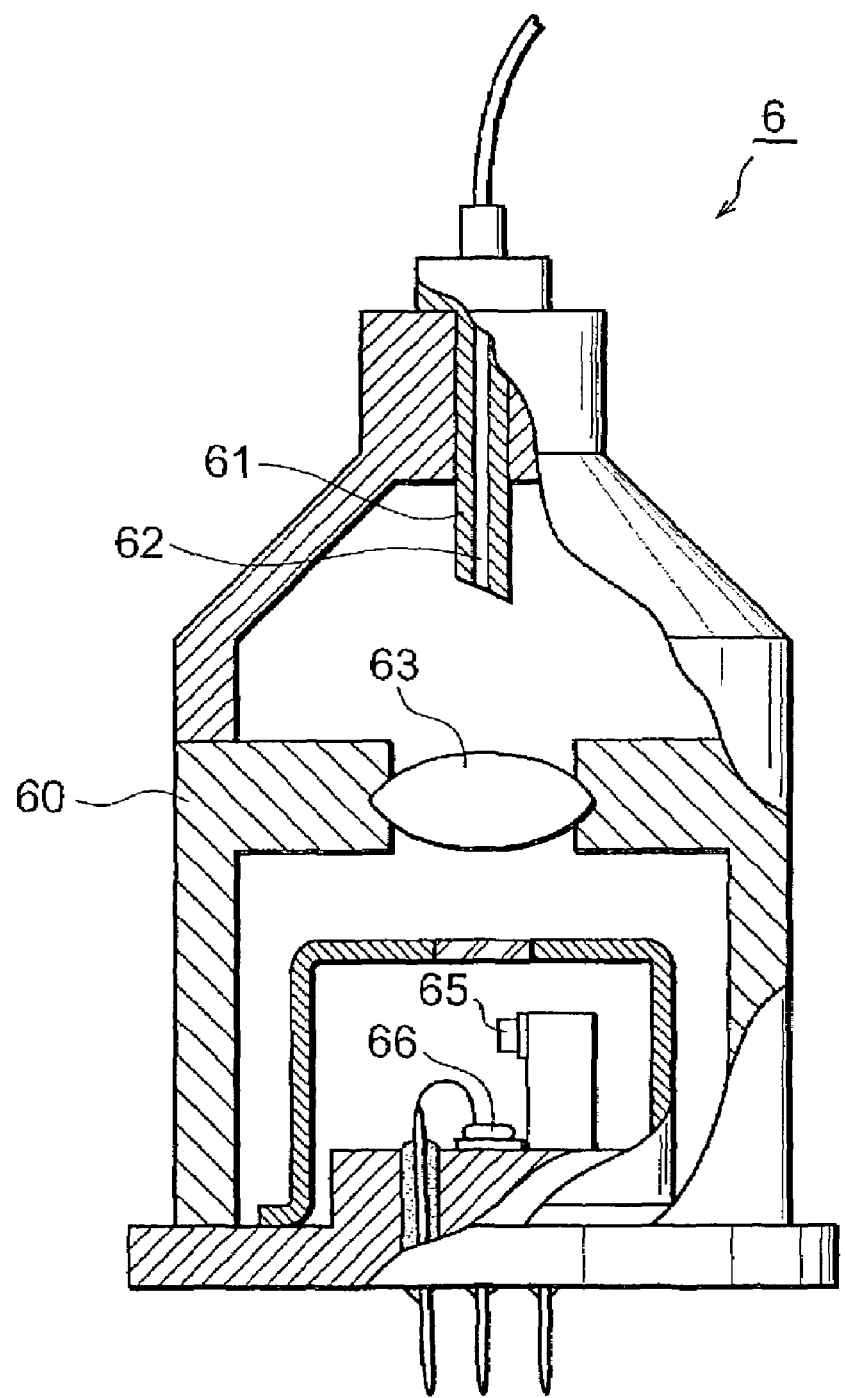
FIG. 9 is a partly cutaway side view of a conventional optical transmission module.
Figure 10:
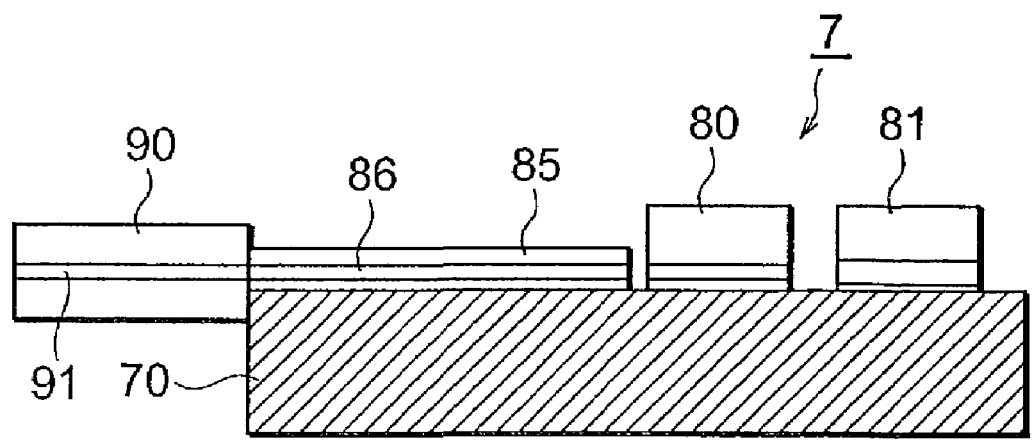
FIG. 10 is a sectional side view of another conventional optical transmission module.
Figure 11:
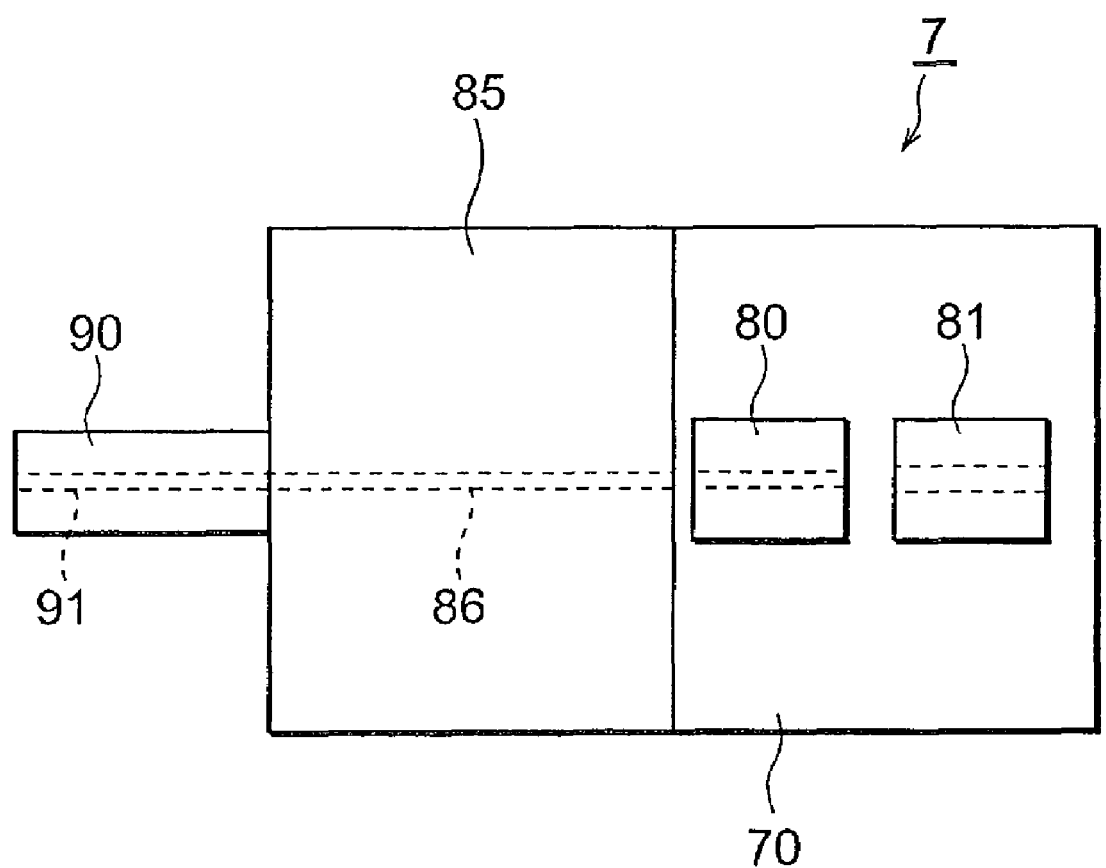
FIG. 11 is a top plan view of the optical transmission module shown in FIG. 10.
Figure 12:
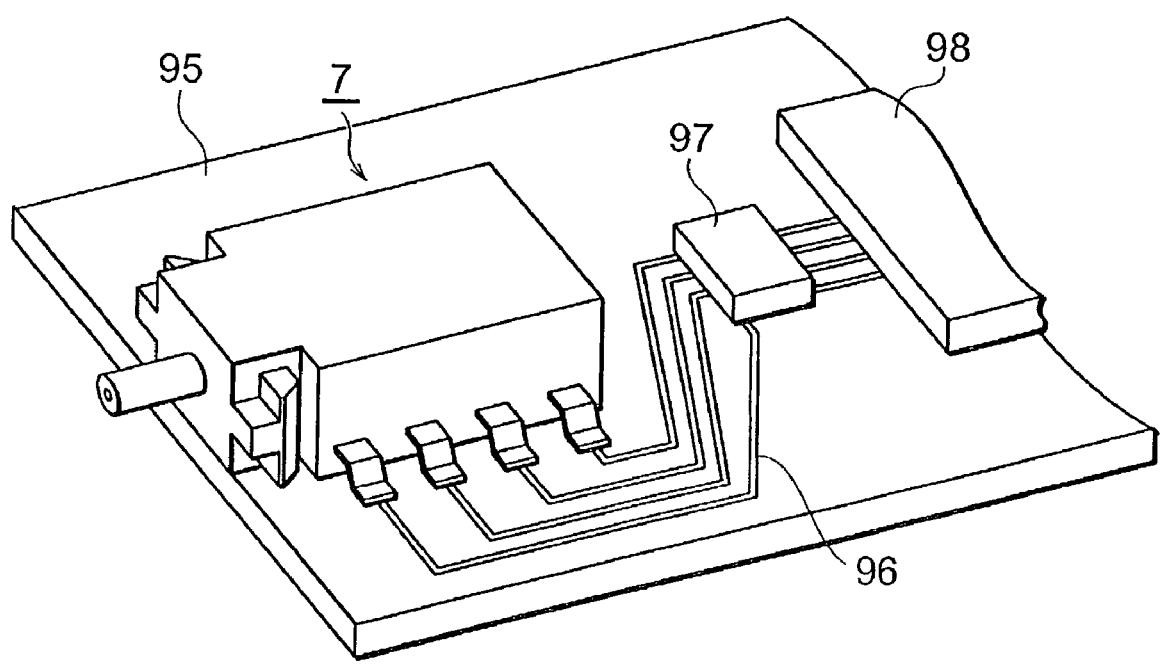
FIG. 12 is a perspective view showing an example in which the optical transmission module shown in FIG. 10 is mounted on a wiring board.

FIG. 7 is a sectional side view of an optical transmission module according to a third embodiment of the present invention. FIG. 8 is a top plan view of the optical transmission module shown in FIG. 7. An optical transmission module 1C is a surface-mounted type optical transmission module which includes a substrate 10, a laser diode array 22, a planar surface optical waveguide element 27, and a driving device 35.

The laser diode array 22, which is provided on the substrate, is a light-emitting-device array in which N-number (N is an integer of two or more) of laser diodes serving as light emitting devices are arranged in parallel to convert electric signals into N-channel optical signals to be transmitted by the optical transmission module 1C. FIGS. 7 and 8 show a four-channel structure (N is four) as an example.

In addition to the laser diode array 22, the optical waveguide element 27 is also placed on the substrate 10. The optical waveguide element 27 has N-number of planar surface optical waveguides 28 serving as optical transmission lines that transmit and output N-channel optical signals emitted from the corresponding laser diodes in the laser diode array 22. The N-number of optical waveguides 28 are arranged in parallel corresponding to the N-number of laser diodes of the laser diode array 22.

The laser diode array 22 and the optical waveguide element 27 are arranged such that the optical axes of the laser diodes and the optical axes of the corresponding optical waveguides 28 serving as the optical transmission lines are aligned with each other. This allows optical signals emitted from front ends of the N-number of laser diodes of the laser diode array 22 to efficiently enter the corresponding optical waveguides 28.

A ferrule 42 is connected to a downstream end of the optical waveguide element 27. In the ferrule 42, N-number of optical fibers 43 for outputting optical signals extend in parallel to form an optical fiber ribbon, as shown in FIG. 8. The ferrule 42 is placed such that the optical fibers 43 are optically connected to the corresponding optical waveguides 28.

A photodiode array 52 is placed on the substrate 10 behind (on the backward side of) the laser diode array 22. The photodiode array 52 is a light-receiving-device array in which N-number of photodiodes serving as monitoring light-receiving devices for detecting backward light emitted backward from N-number of laser diodes in the laser diode array 22 are arranged in parallel. The photodiode array 52 is placed at a predetermined position on the side opposite to the optical waveguides 28 serving as the optical transmission lines relative to the laser diode array 22 such that the optical axes of the photodiodes are aligned with the optical axes of the corresponding laser diodes of the laser diode array 22.

The driving device 35 is a circuit device that has N-number of driving elements for supplying necessary electric signals, such as electric signals to be converted into optical signals, to the N-number of laser diodes of the laser diode array 22 in order to control the driving of the laser diode array 22. The driving device 35 is placed at a predetermined position on the upper surface of the optical waveguide element 27. That is, the driving device 35 is placed at a predetermined position on the same side as the optical waveguides 28 serving as the optical transmission lines, relative to the laser diode array 22. In order to input electrical signals from N-number of driving elements of the driving device 35 to the corresponding laser diodes of the laser diode array 22, the electrodes 23 of the laser diode array 22 and the corresponding electrodes 36 of the driving device 35 are electrically connected by bonding wires, respectively.

A metal lead frame 11 is provided on the bottom face of the substrate 10. The lead frame 11 functions as an electrical connecting means for connecting N-number of driving elements of the driving device 35 to the outside. The lead frame 11 has a predetermined number of lead pins 12 formed on the upstream side, which is the side opposite to the ferrule 42, and on both right and left sides of the center axis, which is in parallel with the optical-signal transmitting direction, in the optical transmission module 1C. In order to exchange electric signals between the driving elements of the driving device 35 and the outside, electrodes 37 of the driving device 35 and the corresponding lead pins 12 of the lead frame 11 are electrically connected by bonding wires. Similarly, electrodes 53 of the monitoring photodiode array 52 are electrically connected to the corresponding lead pins 12 of the lead frame 11 by bonding wires.

In the optical transmission module 1C, the entirety thereof containing the substrate 10, the lead frame 11, the laser diode array 22, the optical waveguide element 27 having the optical waveguides 28, the driving device 35, and the monitoring photodiode array 52 is transfer-molded with a predetermined resin, and the resin molding 15 thus formed defines the exterior shape of the optical transmission module 1C. However, the ferrule 42 and the lead pins 12 of the lead frame 11 protrude outward from the resin molding 15.

The laser diode array 22, the optical waveguides 28 serving as the optical transmission lines, and an optical path through which an optical signals passes between the laser diode array 22 and the optical waveguides 28 are filled with a transparent resin that is the same as or different from the resin of the resin molding 15. Similarly, an optical path through which backward light passes between the laser diode array 22 and the monitoring photodiode array 52 is filled with a transparent resin.

In the above-described configuration, when electric signals each for directing the transmission of an optical signal are input from the individual N-number of driving elements of the driving device 30 to the laser diode array 22, they are converted into optical signals by the corresponding laser diodes of the laser diode array 22, and N-channel optical signals are emitted. The optical signals from the laser diodes of the laser diode array 22 enter the corresponding optical fibers 43 extending in the ferrule 40 through the optical paths between the optical waveguides 28 and the laser diodes, and are output from the optical fibers 43 to the outside. N-number of photodiodes of the photodiode array 52 detect backward light emitted from the laser diodes and the driving state of the laser diode array 22 is thereby monitored.

Advantages of the optical transmission module 1C of the third embodiment will be described. The optical transmission module 1C shown in FIGS. 7 and 8 has a surface-mounted structure, and the driving device 35 is placed on the same side as the optical transmission lines (downstream side) relative to the laser diode array 22. This can reduce the size of the optical transmission module 1C. Moreover, since the driving device 35 is placed close to the laser diode array 22, the connection lengths between the laser diodes of the laser diode array 22 and the corresponding driving elements of the driving device 35 can be sufficiently reduced. Consequently, the laser diodes can be driven at high speed, and the optical transmission module 1C is capable of high-speed transmission of optical signals.

In the third embodiment, the laser diode array 22 in which N-number (N is an integer of two or more) of laser diodes are arranged in parallel is used as the light emitting device, and the optical waveguide element 27 in which N-number of optical waveguides 28 are arranged in parallel and the driving device 35 in which N-number of driving elements are arranged in parallel, each corresponding to N-number of laser diodes, are used as the optical transmission line and the driving device, respectively. Consequently, N-channel (multiple-channel) optical signals can be transmitted from the single optical transmission module 1C, and the size of the optical transmission module per optical signal can be reduced further.

The optical transmission module of the present invention is not limited to the above-described embodiments, and various modifications are possible. For example, a device other than the laser diode may be used as the light emitting device for converting an electric signal into an optical signal. The optical transmission line is not limited to the planar surface optical waveguide and the optical fiber having ferrule, and for example, an optical fiber having no ferrule may be used. The monitoring photodiode for detecting backward light from the laser diode may be omitted if unnecessary.

While the planar surface optical waveguides are used as the optical transmission lines for transmitting N-channel optical signals from the light emitting devices in the optical transmission module 1C shown in FIGS. 7 and 8, a similar structure is also available in a case in which N-number of optical fibers are used as the optical transmission lines.

What is claimed is:

1. An optical transmission module comprising:
a rectangular substrate;
a semiconductor laser directly placed on an upper surface of said substrate to convert an electric signal into an optical signal and to output the optical signal parallel to said upper surface of said substrate, said semiconductor laser including a front end face from which the optical signal is output and a rear end face from which backward light is output;
a planar surface optical waveguide on said upper surface of said substrate and adjacent to said front end face of said semiconductor laser to transmit and output the optical signal from said semiconductor laser to the outside of said optical transmission module;
an optical fiber having a ferrule and provided at a downstream end of said optical waveguide;
a driving device for driving said semiconductor laser, said driving device being placed directly on an upper surface of said optical waveguide; and
a monitoring light-receiving device for detecting the backward light emitted from said semiconductor laser, wherein the light receiving device is on said upper surface of said substrate and adjacent to said rear end face of said semiconductor laser.

2. An optical transmission module according to claim 1, wherein said optical waveguide is composed of an optical fiber or a ferrule having an optical fiber extending therein.

3. An optical transmission module according to claim 1, further comprising:
a metal lead frame serving as electrical connecting means for connecting said driving device to the outside.

4. An optical transmission module according to claim 1, wherein the entirety of said optical transmission module containing said substrate, said semiconductor laser, said optical waveguide, and said driving device is molded with a resin.

5. An optical transmission module comprising:
a rectangular substrate
more than one semiconductor laser arranged in parallel directly on an upper surface of said substrate, wherein each semiconductor laser is adapted to convert an electric signal into an optical signal and output the optical signal parallel to said upper surface of said substrate, and wherein each semiconductor laser has a front end face from which the optical signal is output and a rear end face from which backward light is output;
more than one planar surface optical waveguide arranged in parallel on said upper surface of said substrate and adjacent to said front end face of associated ones of said semiconductor lasers, wherein each planar surface optical waveguide is adapted to transmit and output the optical signal from an associated one of said semiconductor lasers to outside said optical transmission module;
more than one driving device arranged in parallel, each driving device being adapted to drive an associated one of said semiconductor lasers, said driving devices being placed directly on an upper surface of said optical waveguides; and
a monitoring light-receiving device for detecting the backward light emitted from said semiconductor lasers, wherein the light-receiving device is on said upper surface of said substrate and adjacent to said rear end face of said semiconductor lasers.

* * * * *